(12) United States Patent
Fernando

(10) Patent No.: US 8,774,334 B2
(45) Date of Patent: Jul. 8, 2014

(54) DYNAMIC RECEIVER SWITCHING

(75) Inventor: Udara C. Fernando, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 72 days.

(21) Appl. No.: 13/402,781

(22) Filed: Feb. 22, 2012

(65) Prior Publication Data

US 2013/0114769 A1　May 9, 2013

Related U.S. Application Data

(60) Provisional application No. 61/557,838, filed on Nov. 9, 2011.

(51) Int. Cl.
*H04B 1/10* (2006.01)
*H04B 1/00* (2006.01)

(52) U.S. Cl.
USPC .......................................... 375/349; 375/130

(58) Field of Classification Search
USPC ................. 375/349, 130, 147, 148, 316, 346;
370/208, 210; 342/195, 357.51,
342/357.73; 455/73, 83, 138
See application file for complete search history.

(56) References Cited

U.S. PATENT DOCUMENTS

| | | |
|---|---|---|
| 3,911,364 A | 10/1975 | Langseth et al. |
| 4,035,728 A | 7/1977 | Ishikawa et al. |
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |

(Continued)

FOREIGN PATENT DOCUMENTS

| | | |
|---|---|---|
| CN | 1523912 A | 8/2004 |
| EP | 1164719 A1 | 12/2001 |

(Continued)

OTHER PUBLICATIONS

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

(Continued)

*Primary Examiner* — Khai Tran
(74) *Attorney, Agent, or Firm* — Ramin Mobarhan

(57) ABSTRACT

Techniques for dynamically selecting a number of downconversion paths used in a variety of receiver, wideband receiver architectures, for example, zero-IF or low-IF. In an exemplary embodiment, a first downconversion path is configured to downconvert a signal derived from an RF signal using a first mixing frequency. A second downconversion path is further configured to downconvert a signal derived from the RF signal using a second mixing frequency distinct from the first mixing frequency. The second downconversion path may be selectively enabled or disabled based on a detected level of an interferer in the frequency spectrum. For example, if the interferer level is less than a predetermined threshold, a fewer number of downconversion paths, for example, one path, may be enabled. If the interferer level is greater than a predetermined threshold, then a greater number of downconversion paths, for example, two or more paths, may be enabled.

22 Claims, 6 Drawing Sheets

(56) References Cited

U.S. PATENT DOCUMENTS

| | | | |
|---|---|---|---|
| 5,056,411 A | 10/1991 | Baker | |
| 5,291,519 A | 3/1994 | Tsurumaru | |
| 5,321,850 A | 6/1994 | Backstrom et al. | |
| 5,345,601 A | 9/1994 | Takagi et al. | |
| 5,390,342 A | 2/1995 | Takayama et al. | |
| 5,559,838 A | 9/1996 | Nakagoshi | |
| 5,566,364 A | 10/1996 | Mizoguchi et al. | |
| 5,694,396 A | 12/1997 | Firouzbakht et al. | |
| 5,697,083 A | 12/1997 | Sano | |
| 5,761,613 A | 6/1998 | Saunders et al. | |
| 5,794,159 A | 8/1998 | Portin | |
| 5,805,643 A | 9/1998 | Seki et al. | |
| 5,805,989 A | 9/1998 | Ushida | |
| 5,835,853 A | 11/1998 | Enoki et al. | |
| 5,940,452 A | 8/1999 | Rich | |
| 5,999,815 A | 12/1999 | TenBrook et al. | |
| 5,999,990 A | 12/1999 | Sharrit et al. | |
| 6,026,288 A | 2/2000 | Bronner | |
| 6,040,732 A | 3/2000 | Brokaw | |
| 6,044,254 A | 3/2000 | Ohta et al. | |
| 6,063,961 A | 5/2000 | Kroner | |
| 6,069,923 A | 5/2000 | Ostman et al. | |
| 6,088,348 A | 7/2000 | Bell, III | |
| 6,208,844 B1 | 3/2001 | Abdelgany | |
| 6,249,687 B1 | 6/2001 | Thomsen et al. | |
| 6,424,683 B1 | 7/2002 | Schoellhorn | |
| 6,430,237 B1 | 8/2002 | Anvari | |
| 6,472,947 B1 | 10/2002 | Zeitz | |
| 6,473,601 B1 | 10/2002 | Oda | |
| 6,522,895 B1 | 2/2003 | Montalvo | |
| 6,535,725 B2 | 3/2003 | Hatcher et al. | |
| 6,600,759 B1 | 7/2003 | Wood | |
| 6,600,907 B1 | 7/2003 | Taguchi | |
| 6,600,931 B2 | 7/2003 | Sutton et al. | |
| 6,657,498 B2 | 12/2003 | Park et al. | |
| 6,806,777 B2 | 10/2004 | Franca-Neto | |
| 6,819,941 B2 | 11/2004 | Dening et al. | |
| 6,888,888 B1 | 5/2005 | Tu et al. | |
| 6,952,594 B2 | 10/2005 | Hendin | |
| 6,954,446 B2 | 10/2005 | Kuffner | |
| 6,983,132 B2 | 1/2006 | Woo et al. | |
| 6,985,712 B2 | 1/2006 | Yamakawa et al. | |
| 6,987,950 B2 | 1/2006 | Coan | |
| 7,013,166 B2 | 3/2006 | Clifford | |
| 7,023,272 B2 | 4/2006 | Hung et al. | |
| 7,024,172 B1 * | 4/2006 | Murphy et al. | 455/324 |
| 7,039,377 B2 | 5/2006 | Yates | |
| 7,142,042 B1 | 11/2006 | Henry | |
| 7,161,423 B2 | 1/2007 | Paul et al. | |
| 7,167,044 B2 | 1/2007 | Li et al. | |
| 7,187,239 B2 | 3/2007 | Yeh | |
| 7,187,735 B2 | 3/2007 | Kent, III et al. | |
| 7,187,904 B2 | 3/2007 | Gainey et al. | |
| 7,212,788 B2 | 5/2007 | Weber et al. | |
| 7,260,377 B2 | 8/2007 | Burns et al. | |
| 7,283,851 B2 | 10/2007 | Persico et al. | |
| 7,299,021 B2 | 11/2007 | Parssinen et al. | |
| 7,313,368 B2 | 12/2007 | Wu et al. | |
| 7,333,831 B2 | 2/2008 | Srinivasan et al. | |
| 7,356,325 B2 | 4/2008 | Behzad et al. | |
| 7,372,336 B2 | 5/2008 | Lee et al. | |
| 7,403,508 B1 | 7/2008 | Miao | |
| 7,444,166 B2 | 10/2008 | Sahota et al. | |
| 7,454,181 B2 | 11/2008 | Banister et al. | |
| 7,477,106 B2 | 1/2009 | Van Bezooijen et al. | |
| 7,486,135 B2 | 2/2009 | Mu | |
| 7,643,847 B2 | 1/2010 | Daanen et al. | |
| 7,643,848 B2 | 1/2010 | Robinett et al. | |
| 7,697,905 B2 | 4/2010 | Lee et al. | |
| 7,728,664 B2 | 6/2010 | Chang et al. | |
| 7,751,513 B2 | 7/2010 | Eisenhut et al. | |
| 7,764,726 B2 | 7/2010 | Simic et al. | |
| 7,848,724 B2 | 12/2010 | Bult et al. | |
| 7,869,528 B2 | 1/2011 | Robinson | |
| 7,877,075 B1 | 1/2011 | Jin et al. | |
| 7,911,269 B2 | 3/2011 | Yang et al. | |
| 7,944,298 B2 | 5/2011 | Cabanillas et al. | |
| 7,949,309 B2 | 5/2011 | Rofougaran et al. | |
| 7,952,398 B2 | 5/2011 | Salcido et al. | |
| 8,022,772 B2 | 9/2011 | Cassia et al. | |
| 8,055,229 B2 | 11/2011 | Huang | |
| 8,063,706 B2 | 11/2011 | Li et al. | |
| 8,081,672 B2 | 12/2011 | Kent et al. | |
| 8,090,332 B2 | 1/2012 | Sahota et al. | |
| 8,090,369 B2 | 1/2012 | Kitazoe | |
| 8,139,670 B1 | 3/2012 | Son et al. | |
| 8,149,955 B2 | 4/2012 | Tired | |
| 8,195,117 B2 | 6/2012 | Bult et al. | |
| 8,217,723 B2 | 7/2012 | Rajendran et al. | |
| 8,270,927 B2 | 9/2012 | Wallace et al. | |
| 8,295,778 B2 | 10/2012 | Kotecha et al. | |
| 8,514,015 B2 | 8/2013 | Chen | |
| 8,571,510 B2 | 10/2013 | Liu et al. | |
| 8,600,315 B2 | 12/2013 | Roufoogaran et al. | |
| 2002/0008575 A1 | 1/2002 | Oskowsky et al. | |
| 2002/0061773 A1 | 5/2002 | Adachi et al. | |
| 2002/0111163 A1 | 8/2002 | Hamabe | |
| 2002/0132597 A1 | 9/2002 | Peterzell et al. | |
| 2002/0173337 A1 | 11/2002 | Hajimiri et al. | |
| 2003/0076797 A1 | 4/2003 | Lozano | |
| 2003/0081694 A1 | 5/2003 | Wieck | |
| 2003/0125040 A1 | 7/2003 | Walton et al. | |
| 2003/0148750 A1 | 8/2003 | Yan et al. | |
| 2003/0157915 A1 | 8/2003 | Atkinson et al. | |
| 2003/0176176 A1 | 9/2003 | Leinonen et al. | |
| 2003/0203743 A1 | 10/2003 | Sugar et al. | |
| 2003/0206076 A1 | 11/2003 | Hashemi et al. | |
| 2003/0228851 A1 | 12/2003 | Taniguchi | |
| 2004/0087290 A1 | 5/2004 | Schmidt et al. | |
| 2004/0092243 A1 | 5/2004 | Hey-Shipton | |
| 2004/0113746 A1 | 6/2004 | Brindle | |
| 2004/0116086 A1 | 6/2004 | Huttunen | |
| 2004/0121753 A1 | 6/2004 | Sugar et al. | |
| 2004/0204104 A1 | 10/2004 | Horng et al. | |
| 2004/0219959 A1 | 11/2004 | Khayrallah et al. | |
| 2004/0224643 A1 | 11/2004 | Nakai | |
| 2004/0253955 A1 | 12/2004 | Love et al. | |
| 2004/0266356 A1 | 12/2004 | Javor et al. | |
| 2005/0039060 A1 | 2/2005 | Okayasu | |
| 2005/0075077 A1 | 4/2005 | Mach et al. | |
| 2005/0079847 A1 | 4/2005 | Arafa | |
| 2005/0118977 A1 | 6/2005 | Drogi et al. | |
| 2005/0197090 A1 | 9/2005 | Stockstad et al. | |
| 2005/0215264 A1 | 9/2005 | Subramaniam et al. | |
| 2005/0265084 A1 | 12/2005 | Choi | |
| 2005/0277387 A1 | 12/2005 | Kojima et al. | |
| 2006/0009177 A1 | 1/2006 | Persico et al. | |
| 2006/0061773 A1 | 3/2006 | Lee et al. | |
| 2006/0128322 A1 | 6/2006 | Igarashi et al. | |
| 2006/0146693 A1 | 7/2006 | Mori et al. | |
| 2006/0189286 A1 | 8/2006 | Kyu et al. | |
| 2006/0234662 A1 | 10/2006 | Diloisy | |
| 2006/0291428 A1 | 12/2006 | Filipovic | |
| 2007/0049332 A1 | 3/2007 | Higuchi | |
| 2007/0060080 A1 | 3/2007 | Nishimura et al. | |
| 2007/0105517 A1 | 5/2007 | Chang et al. | |
| 2007/0142013 A1 | 6/2007 | Bucknor et al. | |
| 2007/0177693 A1 | 8/2007 | Kluge | |
| 2007/0184801 A1 | 8/2007 | Kogawa et al. | |
| 2007/0197170 A1 | 8/2007 | Boos | |
| 2007/0197178 A1 * | 8/2007 | Gu | 455/232.1 |
| 2007/0197204 A1 | 8/2007 | Herczog et al. | |
| 2007/0202890 A1 | 8/2007 | Feher | |
| 2007/0242784 A1 | 10/2007 | Sampson et al. | |
| 2007/0243832 A1 | 10/2007 | Park et al. | |
| 2007/0262817 A1 | 11/2007 | Ciccarelli et al. | |
| 2007/0262871 A1 | 11/2007 | Yamagajo et al. | |
| 2008/0004078 A1 | 1/2008 | Barratt et al. | |
| 2008/0013654 A1 | 1/2008 | Rick et al. | |
| 2008/0117999 A1 | 5/2008 | Kadous et al. | |
| 2008/0204148 A1 | 8/2008 | Kim et al. | |
| 2008/0224770 A1 | 9/2008 | Kim et al. | |
| 2008/0224791 A1 | 9/2008 | Cheng | |
| 2008/0225971 A1 | 9/2008 | Behzad | |

(56) References Cited

U.S. PATENT DOCUMENTS

| | | |
|---|---|---|
| 2008/0261650 A1 | 10/2008 | Piriyapoksombut et al. |
| 2009/0124227 A1 | 5/2009 | Ishiguro |
| 2009/0237161 A1 | 9/2009 | Fagg |
| 2009/0253456 A1 | 10/2009 | Toh et al. |
| 2009/0290659 A1* | 11/2009 | Petrovic et al. ............... 375/340 |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0195754 A1 | 8/2010 | Li et al. |
| 2010/0197263 A1 | 8/2010 | Dwyer et al. |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1* | 2/2012 | Sadri et al. ..................... 370/210 |
| 2012/0044927 A1 | 2/2012 | Pan et al. |
| 2012/0056681 A1 | 3/2012 | Lee |
| 2012/0057621 A1 | 3/2012 | Hong et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0043946 A1 | 2/2013 | Hadjichristos et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |

FOREIGN PATENT DOCUMENTS

| | | |
|---|---|---|
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 2068583 A1 | 6/2009 |
| EP | 1916767 B1 | 12/2010 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | 2000013278 A | 1/2000 |
| JP | 2001285114 A | 10/2001 |
| JP | 2004015162 A | 1/2004 |
| JP | 2007324711 A | 12/2007 |
| WO | 0150636 | 7/2001 |
| WO | 2005039060 | 4/2005 |
| WO | 2005088847 A1 | 9/2005 |
| WO | 2006118538 A2 | 11/2006 |
| WO | 2008092745 A1 | 8/2008 |
| WO | 2008103757 | 8/2008 |
| WO | 2008145604 A1 | 12/2008 |
| WO | 2010059257 A1 | 5/2010 |
| WO | 2011019850 A1 | 2/2011 |
| WO | 2011050729 A1 | 5/2011 |
| WO | WO2011092005 A1 | 8/2011 |
| WO | 2011138697 A1 | 11/2011 |
| WO | 2012008705 A2 | 1/2012 |
| WO | 2013036794 A1 | 3/2013 |

OTHER PUBLICATIONS

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Henrik M et al., "A Full Duplex Front End Module for WiFi 802.11.n Applications", European Microwave Association, vol. 12, No. 4, Oct. 2008, pp. 162-165.

International Search Report and Written Opinion—PCT/US2012/064513—ISA/EPO—Feb. 5, 2013.

Jones W. W., et al., "Narrowband interference suppression using filter-bank analysis/synthesis techniques", Military Communications Conference, 1992. MILC0M '92, Conference REC0R D. Communications—Fusing Command, Control and Intelligence., IEEE San Diego, CA, USA, 11 Oct. 14, 1992, New York, NY, USA IEEE, US, Oct. 11, 1992, pp. 898-902, XP010060840, DOI: 10.1109/MILCOM.1992.243977, ISBN: 978-0-7803-0585-4.

Jussi R et al., "A Dual-Band RF Front-End for WCDMA and GSM Applications", IEEE, Journal Solid-State Circuits, 2001, vol. 36, No. 8, pp. 1198-1204.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

(56) References Cited

OTHER PUBLICATIONS

Lee et al., "Development of Miniature Quad SAW filter bank based on PCB substrate", IEEE Intl Frequency Control Symp, pp. 146-149, 2007.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre ; 650, Route Des LUCI0LES ; F-06921 Sophia-Antipolis Cedex ; France, No. Miyazaki; Oct. 12, 2009, XP050388547, [retrieved on Oct. 6, 20009].

Rahn D.G., et al., "A fully integrated multiband MIMO WLAN transceiver RFIC," IEEE J. Solid-State Circuits, 2005, vol. 40 (8), 1629-1641.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107.

Tasic A. et al., "Design of Adaptive Multimode RF Front-End Circuits", IEEE Journal of Solid-State Circuits, vol. 42, Issue 2, Feb. 2007 pp. 313-322.

Winternitz, et al., "A GPS Receiver for High-Altitude Satellite Navigation," IEEE Journal of Selected Topics in Signal Processing, vol. 3, No. 4, pp. 541-556, Aug. 2009.

Hwang, et al., "A High IIP2 Direct-Conversion Receiver using Even-Harmonic Reduction Technique for Cellular CDMA/PCS/GPS applications," IEEE Transaction on Circuits and Systems, 2008.

Kevin W et al., "3G/4G Multimode Cellular Front End Challenges", Part 2: Architecture Discussion, RFMD® White Paper, 2009, 9 pages.

MSM6000 Chipset Solution, Qualcomm Incorporated, 2003.

MSM6500 Chipset Solution, Qualcomm Incorporated, 2004.

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, no. Dresden, Germany; 20100628, Jun. 22, 2010, XP050449298, [retrieved on Jun. 22, 2010] the whole document.

"UMTS Picocell Front End Module", CTS Corp., 2007, 8 pages.

\* cited by examiner

DYNAMIC RECEIVER SWITCHING

CLAIM OF PRIORITY UNDER 35 U.S.C. §119

This application is a non-provisional application claiming priority to provisional application Ser. No. 61/557,838, filed on Nov. 9, 2011, entitled "DYNAMIC SWITCHING BETWEEN RECEIVERS", and assigned to the assignee hereof and hereby expressly incorporated by reference herein.

BACKGROUND

1. Field

The disclosure relates to techniques for dynamically configuring a receiver to switch amongst two or more downconversion paths.

2. Background

In the design of communication circuits, a wideband receiver may be configured to simultaneously receive information on multiple channels. To do this, the wideband receiver may utilize more than one downconversion path by mixing a received radio-frequency (RF) signal with a plurality of local oscillators (LO's) each having a distinct LO frequency. For example, a first receive channel at a given center frequency may be downconverted using a first LO having a first LO frequency, while a second receive channel at a different center frequency may be downconverted using a second LO having a second LO frequency.

While providing such multiple downconversion paths may advantageously ease the channel filter and/or other rejection requirements for each downconversion path, it may also unnecessarily increase power consumption in certain cases. For example, when the interference levels due to jammers are relatively low, the improved receive performance afforded by the multiple downconversion paths may not be necessary.

It would be desirable to provide techniques for dynamically configuring a number of downconversion paths used in a wideband receiver to optimize the tradeoff between receiver performance and power consumption.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
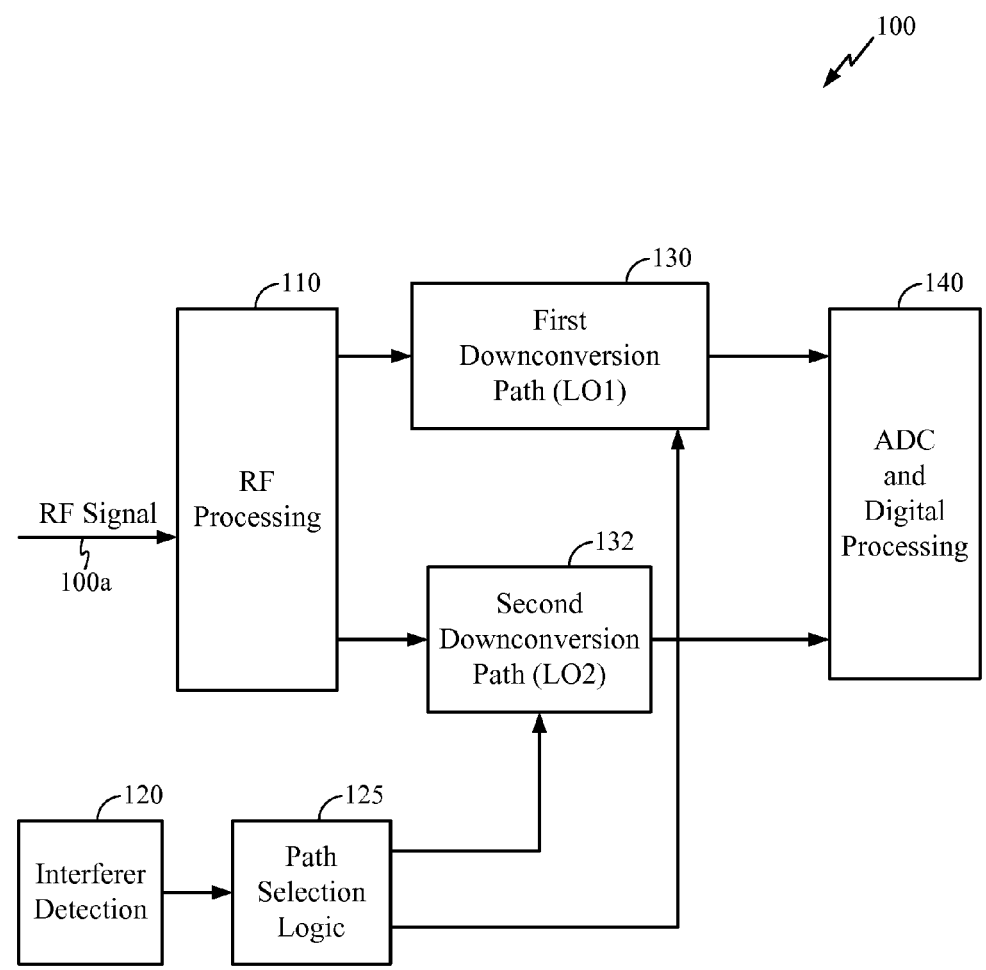
FIG. 1 illustrates an exemplary embodiment of a receiver according to the present disclosure.

FIG. 1 illustrates an exemplary embodiment of a receiver 100 according to the present disclosure. Note the receiver 100 is shown for exemplary purposes only, and is not meant to restrict the scope of the present disclosure. For example, while two downconversion paths are shown in FIG. 1, the techniques of the present disclosure may be readily applied to accommodate receivers having more than two downconversion paths. Such alternative exemplary embodiments are contemplated to be within the scope of the present disclosure.

In FIG. 1, an RF signal 100a is coupled to an RF processing block 110. In an exemplary embodiment, RF processing block 110 may include RF filters, one or more LNA's, etc., that perform radio frequency processing on the RF signal 100a. The output of block 110 is coupled to first downconversion path 130 and second downconversion path 132, which downconvert the output of RF processing block 110 to lower frequencies. For example, first downconversion path 130 mixes the output of RF processing block 110 with a local oscillator (LO1) having a first mixing frequency, while second downconversion path 132 mixes the output of RF processing block 110 with a local oscillator (LO2) having a second mixing frequency. In this specification and in the claims, a single "downconversion path" will be understood to refer to any circuitry designed to mix a signal with a local oscillator having a distinct frequency. For example, a single downconversion path may include dual mixers for mixing a signal with in-phase (I) and quadrature (Q) versions of a single local oscillator.

In an exemplary embodiment, LO1 and LO2 may mix distinct channels in the RF outputs of RF processing block 110 each down to a zero frequency (e.g., according to a zero-IF architecture). In alternative exemplary embodiments, the local oscillators may mix the RF channels down to one or more low intermediate frequencies (e.g., according to a low IF architecture). The outputs of blocks 130 and 132 are provided to an A/D converter (ADC) and digital processing block 140. Block 140 may convert the outputs of blocks 130 and 132 to a digital signal, and additionally process the digital signal using digital processing hardware.

Further shown in FIG. 1 is an interferer detection block 120 coupled to a path selection logic block 125. Block 120 may detect the presence of an interferer signal anywhere in the signal processing path shown in FIG. 1, and pre-programmed logic in block 125 may enable or disable either of the blocks 130 and 132 in response to detecting a level of interferer detection, as further described hereinbelow. Note in alternative exemplary embodiments incorporating more than two downconversion paths (not shown), the block 125 may be similarly configured to enable or disable any one or plurality of the downconversion blocks. Further note that while the interferer detection block 120 and path selection logic block 125 are shown as separate blocks in FIG. 1, it will be appreciated that they may be implemented as a single block in alternative exemplary embodiments.

Figure 2:
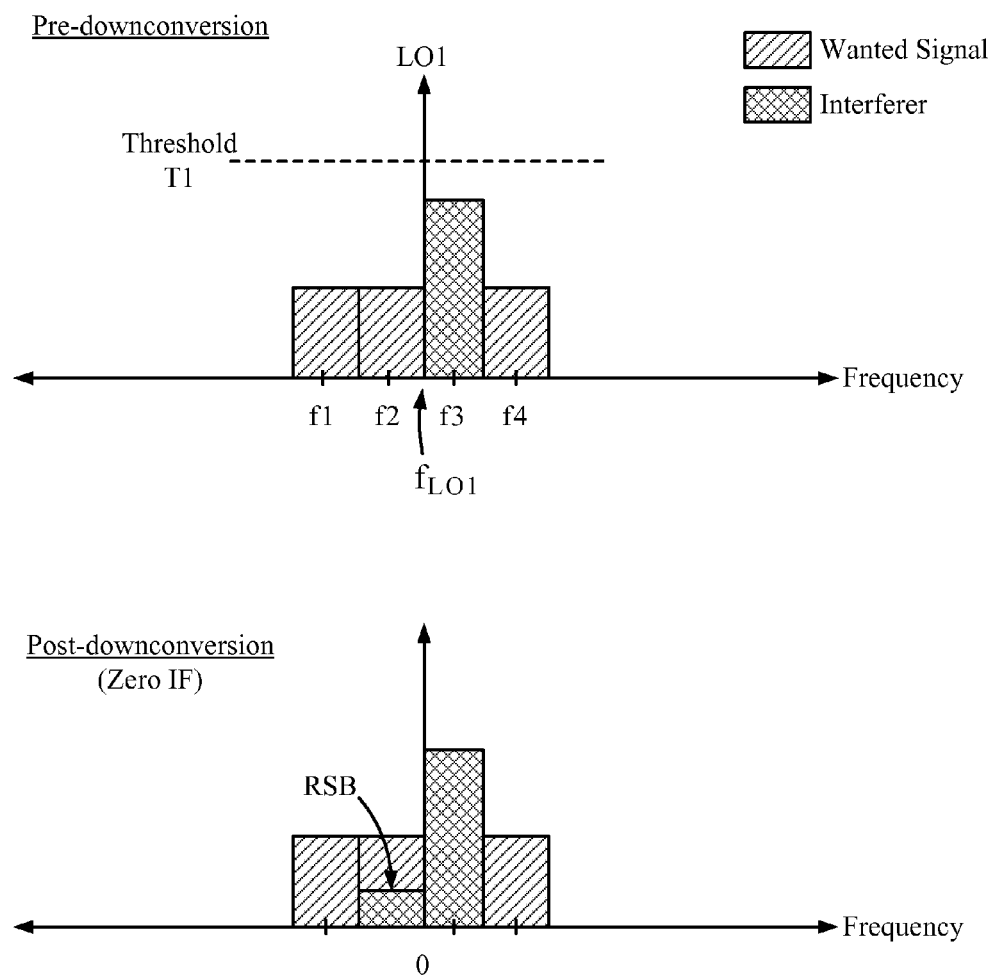
FIG. 2 illustrates an example of frequency spectra that may be present in the signal path of the receiver shown in FIG. 1, when a single local oscillator is used for downconversion.

FIG. 2 illustrates an example of frequency spectra that may be present in the signal path of the receiver 100 shown in FIG. 1, when a single downconversion path with corresponding local oscillator (LO1) is used for downconversion. In FIG. 2, the top (pre-downconversion) RF frequency spectrum shows three wanted signals centered at f1, f2, and f4, and an interferer centered at f3. A single local oscillator LO1 is centered at frequency $f_{LO1}$, wherein $f_{LO1}$ is between f2 and f3. The bottom (post-downconversion) plot shows the spectrum following downconversion by LO1, with $f_{LO1}$ now centered at zero frequency corresponding to zero IF. Note a residual side band (RSB) corresponding to the interferer is present in the post-downconversion spectrum. The RSB may be generated in the post-downconversion spectrum by, for example, imbalance in the I and Q signal paths of the receiver, and may undesirably interfere with some portion of the wanted signal, as shown in FIG. 2.

Figure 3:
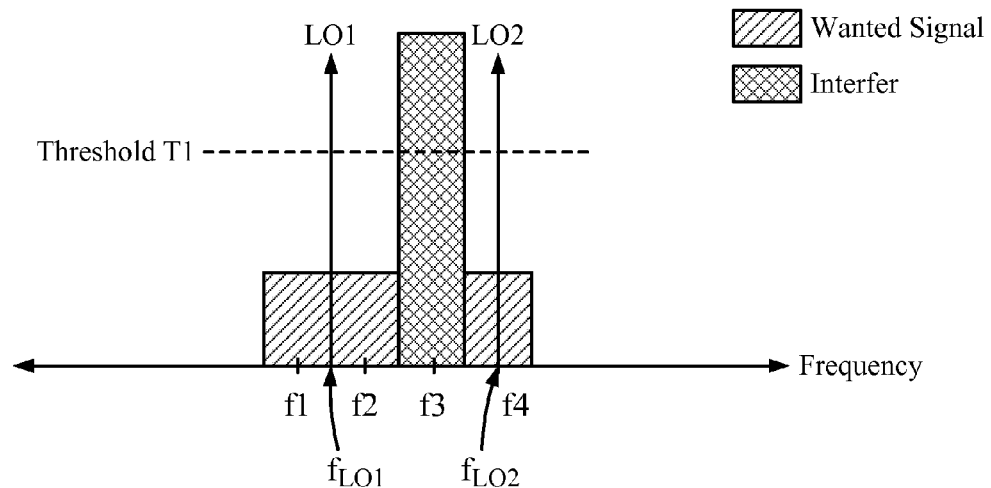
FIG. 3 illustrates an example of frequency spectra that may be present in the signal path of the receiver shown in FIG. 1, when two local oscillators are used for downconversion.
Figure 3:
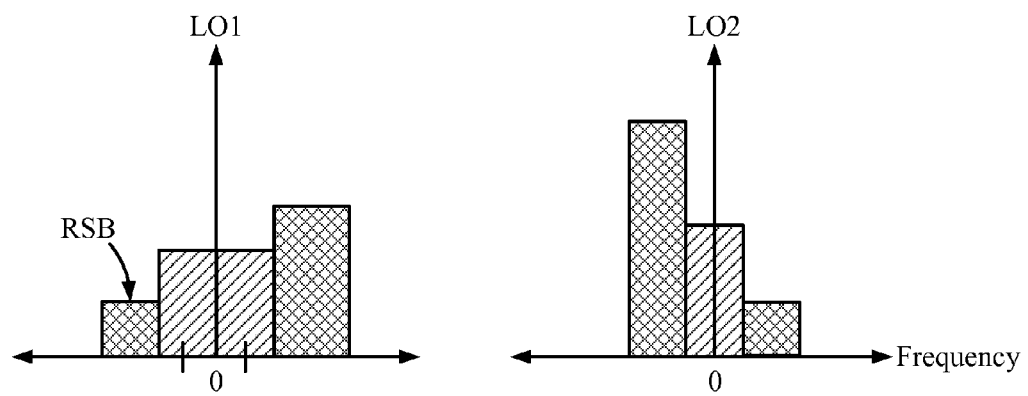

FIG. 3 illustrates an example of frequency spectra that may be present in the signal path of the receiver 100 shown in FIG. 1, when two downconversion paths with corresponding local oscillators are used for downconversion. In FIG. 3, the top (pre-downconversion) RF frequency spectrum shows two local oscillators LO1 and LO2 centered at frequencies $f_{LO1}$ and $f_{LO2}$, respectively, wherein $f_{LO1}$ is between f1 and f2, and $f_{LO2}$ corresponds to f4. The bottom (post-downconversion) plots show the baseband spectra following downconversion by LO1 and LO2. For the downconversion path employing LO1, the baseband spectrum shows the wanted signals (corresponding to f1 and f2) around zero IF, while the interferer and the RSB of the interferer are shown attenuated outside the baseband. For the downconversion path employing LO2, the baseband spectrum shows the wanted signal (corresponding to f4) at zero IF, and the interferer outside the baseband channel. In FIG. 3, it will be appreciated that because two separate downconversion paths are used, the receiver 100 may advantageously avoid placing the RSB of the interferer into a wanted signal, in contrast to the case of a single downconversion path as shown in FIG. 2. It will, however, also be appreciated that employing two downconversion paths versus one may also increase power consumption in the receiver.

It would be desirable to provide techniques for dynamically switching amongst one, two, or even more downconversion paths in a receiver based on channel conditions, for example, the power and frequencies of interferers detected in the spectrum.

According to the present disclosure, an interferer detection block 120 such as shown in FIG. 1 may be employed to detect interferers in the spectrum, and a block 125 may dynamically configure the number of downconversion paths to be enabled based on the detected interferers. In an exemplary embodiment, the interferer detection block 120 may measure the interference power present at any frequency, and the path selection logic block 125 may determine whether such power exceeds a predetermined threshold. An interferer frequency may be determined, for example, using knowledge of the frequencies at which the wanted signals are expected. If the measured interference power does not exceed the predetermined threshold, then a single downconversion path may be used. Alternatively, if the measured interference power exceeds the predetermined threshold, then multiple downconversion paths may be used.

For example, in FIG. 2, a predetermined threshold T1 is shown in the pre-downconversion spectrum. In an exemplary embodiment, as the interferer at f3 does not exceed T1, a single downconversion path is enabled, and the other downconversion path is disabled. On the other hand, in FIG. 3, as the interferer at f3 does exceed T1, two downconversion paths are enabled. By dynamically selecting the number of downconversion paths as described, receiver performance and power consumption may be efficiently optimized.

Figure 4:
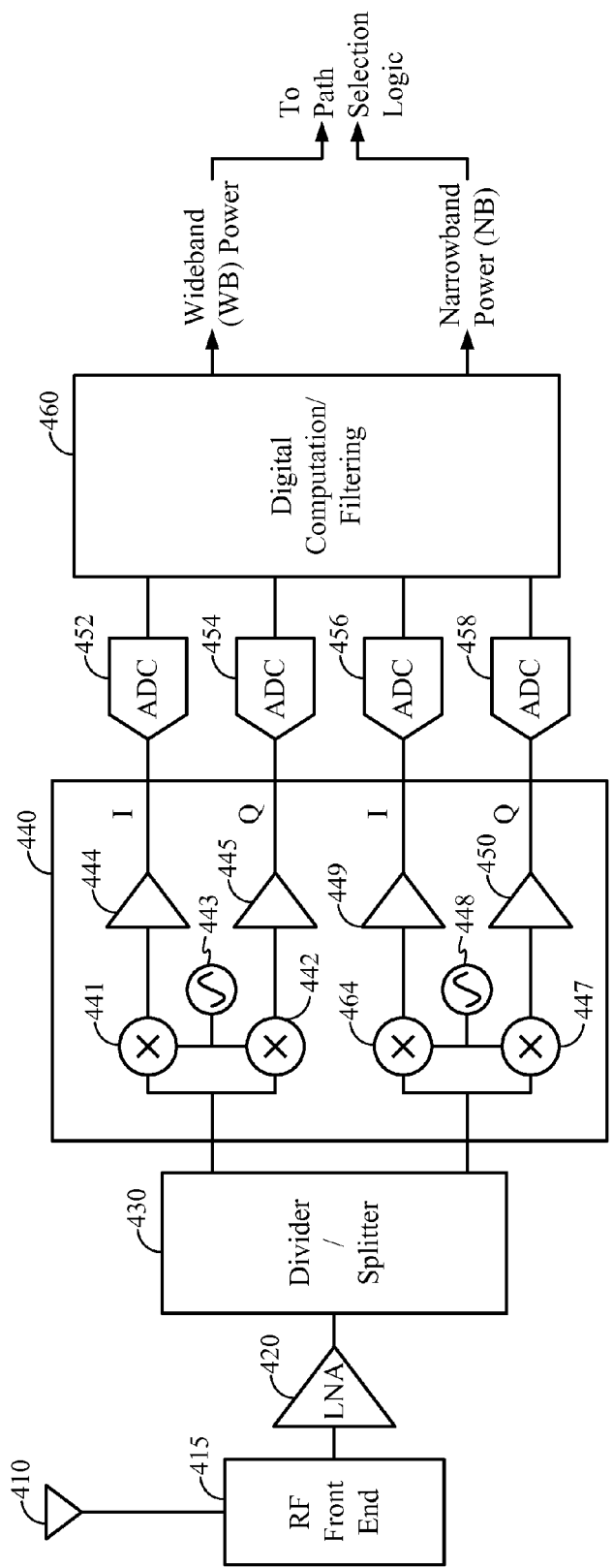
FIG. 4 illustrates an exemplary embodiment of a receiver having two downconversion signal paths according to the present disclosure.

FIG. 4 illustrates an exemplary embodiment of a receiver 400 having two downconversion signal paths according to the present disclosure. Note the exemplary embodiment shown in FIG. 4 is not meant to limit the scope of the present disclosure, and other exemplary embodiments having alternative partitioning of signal paths other than that shown in FIG. 4 are contemplated to be within the scope of the present disclosure.

In FIG. 4, an antenna 410 is coupled to a low noise amplifier (LNA) 420. The output of the LNA 420 is coupled to a divider/splitter 430, which splits the RF signal output of the LNA into at least two signals, one for each downconversion path. A first of these signals is provided to a first downconversion signal path of a mixer block 440, including I and Q mixers 441, 442, local oscillator 443, and trans-impedance amplifiers 444 and 445. A second signal is provided to a second downconversion signal path of block 440, including I and Q mixers 446, 447, local oscillator 448, and trans-impedance amplifiers 449 and 450. The outputs of the mixer block 440 are digitized by analog to digital converters (ADC's) 452, 454, 456, 458. The digital outputs of the ADC's are provided to a digital block 460, which may perform, for example, digital computation and/or filtering. As part of its computation, block 460 may output interference metrics including a wideband power (WB) and a narrowband power (NB), both of which may be computed from the digitized outputs of the mixer block 440.

In an exemplary embodiment, the wideband power (WB) may be computed by computing the sum $I^2+Q^2$ (i.e., a squared magnitude) of the digitized I/Q outputs of block 440 prior to digital filtering performed by the block 460. The narrowband power (NB), on the other hand, may be computed as the sum $I^2+Q^2$ of post-filtered versions of the digitized I/Q outputs of block 440. To decide whether to use a single downconversion path or two downconversion path for receiving, a path selection logic block such as block 125 shown in FIG. 1 may employ logic such as the following:

if WB<NB+FM, then enable a single path;
if WB>NB+FM, then enable two paths;
wherein FM corresponds to a predetermined fading margin.

Figure 5:
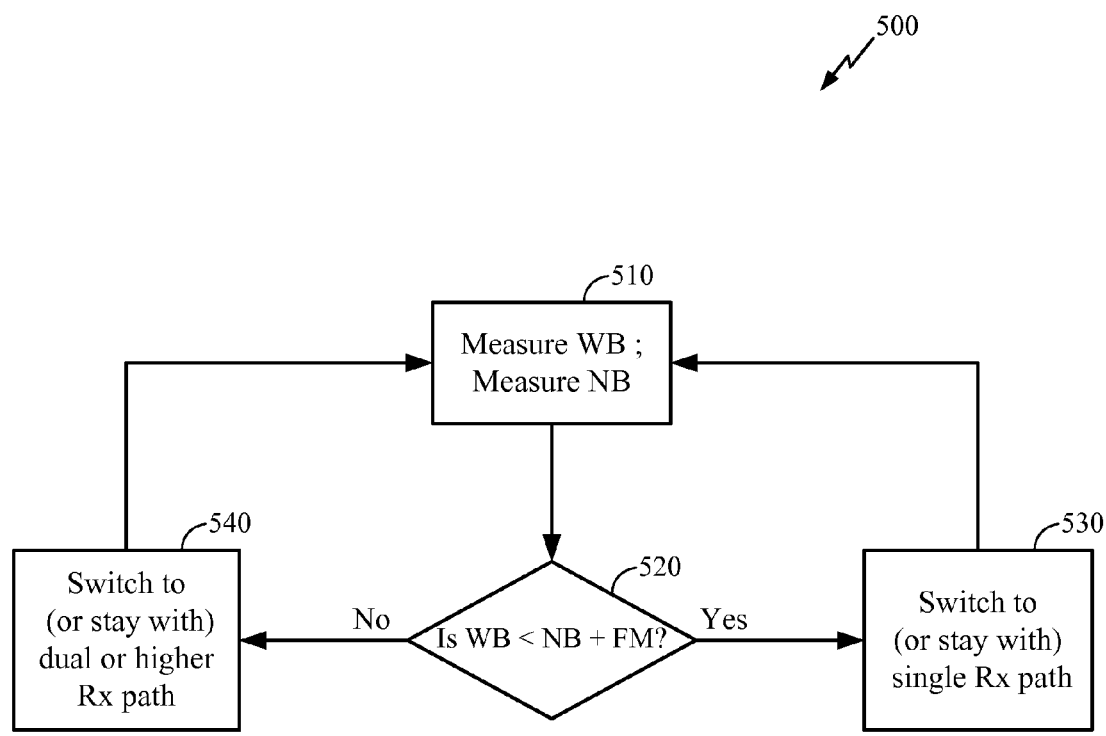
FIG. 5 illustrates an exemplary embodiment of a scheme for switching between one or two downconversion paths according to the present disclosure.

FIG. 5 illustrates an exemplary embodiment of a scheme for switching between one or two downconversion paths according to the present disclosure. It will be appreciated that schemes for accommodating more than two downconversion paths may be readily derived in light of the present disclosure, and such alternative exemplary embodiments are contemplated to be within the scope of the present disclosure.

In FIG. 5, at block 510, the wideband power (WB) and narrowband power (NB) are measured, e.g., as described with reference to FIG. 4.

At block 520, it is determined whether WB is greater than NB+FM. If so, then the scheme may proceed to block 530, wherein operation is switched to (or remains with) a single downconversion path. The scheme then returns to block 510.

If WB is not greater than NB+FM, then the scheme may proceed to block 540, wherein operation is switched to (or remains with) two or more downconversion paths. The scheme then returns to block 510.

It will be appreciated that alternative logic schemes may readily be designed to utilize the detected interference information to select the number of downconversion signal paths. For example, in alternative exemplary embodiments, the threshold or margin utilized to switch from one downconversion path to two downconversion paths may be different from the threshold or margin utilized to switch from two downconversion paths to one downconversion path. Hysteresis may further be employed when determining appropriate levels to switch. Any of the predetermined thresholds may be configured depending on channel allocation information received from a base station. Alternative exemplary embodiments employing other types of path selection logic are contemplated to be within the scope of the present disclosure.

One of ordinary skill in the art will appreciate in light of the present disclosure that many possible techniques may be employed for interferer detection, other than those explicitly described in this disclosure. For example, interference detection may be performed in the RF or analog domain, using one or more blocks not shown in FIG. 4. Furthermore, alternative digital techniques may be employed to determine the presence of interferers in the spectrum. Alternatively, the interferer detection module may receive an indication of interferer strength from a base station, or from any other information source. Exemplary embodiments employing other types of interference detection techniques known in the art are contemplated to be within the scope of the present disclosure.

Figure 6:
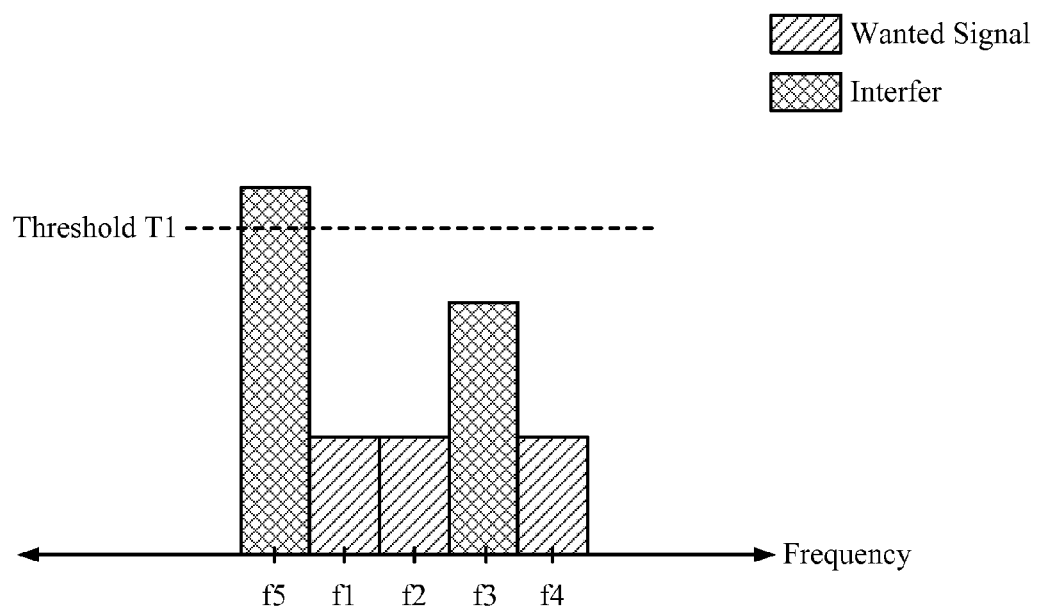
FIG. 6 illustrates an exemplary embodiment of a pre-downconversion spectrum wherein an additional interferer is present at frequency f5.

While certain exemplary embodiments have been described wherein the one or more interferer signal has a frequency that lies within a group of wanted signals, it will be appreciated that the techniques of the present disclosure may readily be applied to cases wherein an interferer signal has a frequency that lies outside a group of wanted signals. FIG. 6 illustrates an exemplary embodiment of a pre-downconversion spectrum wherein an additional interferer is present at frequency f5. According to the present disclosure, an interferer detection block such as block 120 in FIG. 1 may also be configured to detect such interference, and re-configure the number of downconversion paths based on such detection. Such alternative exemplary embodiments are contemplated to be within the scope of the present disclosure.

In contrast to the exemplary embodiment shown in FIG. 4, alternative exemplary embodiments may, for example, incorporate a separate LNA and/or antenna for each downconversion path. In particular, each downconversion path may be provided on a separate chip or integrated circuit, and a common interference detection/path selection logic module may be provided to selectively enable the circuitry corresponding to each downconversion path. Such alternative exemplary embodiments are contemplated to be within the scope of the present disclosure.

Note the techniques of the present disclosure may readily be applied to accommodate more than two downconversion paths. For example, in a receiver having three downconversion paths, the interferer detection/path selection logic module may be configured to disable any one or two of the downconversion paths in response to the detected levels of interference being compared to one, two, or more thresholds. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus for processing a radio-frequency (RF) signal comprising:
a first downconversion path configured to downconvert a first signal derived from the RF signal using a first mixing frequency;
a second downconversion path configured to downconvert a second signal derived from the RF signal using a second mixing frequency distinct from the first mixing frequency, wherein the second downconversion path is configurable to be disabled when a detected level of an interferer in the RF signal is less than a first predetermined threshold.

2. The apparatus of claim 1, further comprising an interferer detection module configured to detect the level of the interferer present in the RF signal.

3. The apparatus of claim 1, further comprising a path selection logic module configured to disable the second downconversion path when the detected interferer level is less than a first predetermined threshold.

4. The apparatus of claim 3, wherein the path selection logic module is further configured to enable the second downconversion path when the detected interferer level is greater than a second predetermined threshold.

5. The apparatus of claim 4, wherein the second predetermined threshold is equal to the first predetermined threshold.

6. The apparatus of claim 1, each of the first and second downconversion paths comprising two mixers configured to mix the RF signal with in-phase (I) and quadrature (Q) versions of a local oscillator signal, respectively.

7. The apparatus of claim 2, further comprising at least one analog-to-digital converter for digitizing the output of the first and second downconversion paths, the interferer detection module comprising a module configured to detect the level of the interferer in the digital domain.

8. The apparatus of claim 7, the interferer detection module configured to compare a squared magnitude of the digitized first downconversion path output to a squared magnitude of a filtered version of the digitized first downconversion path output, the apparatus being configured to enable the second downconversion path when the squared magnitude of the digitized first downconversion path output is greater than a squared magnitude of a filtered version of the digitized first downconversion circuitry output.

9. The apparatus of claim 2, wherein the interferer detection module receives an indication of interferer strength from a base station.

10. The apparatus of claim 1, wherein the first predetermined threshold is configured depending on channel allocation information received from a base station.

11. The apparatus of claim 1, wherein the first downconversion path and the second downconversion path comprise zero-IF conversion circuitry.

12. The apparatus of claim 1, wherein both the first signal and the second signal are derived from the output of a single low-noise amplifier (LNA).

13. The apparatus of claim 1, wherein the first signal is derived from a first LNA and first antenna, and the second signal is derived from a second LNA and second antenna.

14. The apparatus of claim 13, wherein the first LNA, first antenna, and first downconversion path are provided on a first chip, and the second LNA, second antenna, and second downconversion path are provided on a second chip.

15. The apparatus of claim 1, wherein the first downconversion path and the second downconversion path comprise low-IF conversion circuitry.

16. The apparatus of claim 1, wherein the first and second signals are the same signal.

17. A method for processing a radio-frequency (RF) signal comprising:
mixing a first signal derived from the RF signal with a first local oscillator signal having a first frequency;
mixing a second signal derived from the RF signal with a second local oscillator signal having a second frequency distinct from the first frequency; and disabling the mixing the second signal if a detected level of an interferer present in the RF signal is less than a first predetermined threshold.

18. The method of claim 17, further comprising enabling the mixing the second signal if the detected interferer level is greater than a second predetermined threshold.

19. An apparatus for processing a radio-frequency (RF) signal comprising:
   first downconversion means for downconverting the RF signal using a first mixing frequency;
   second downconversion means for downconverting the RF signal using a second mixing frequency distinct from the first mixing frequency when a detected interferer level is greater than a first predetermined threshold.

20. The apparatus of claim 19, further comprising interferer detection means for detecting the level of an interferer present in the RF signal.

21. The apparatus of claim 20, further comprising path selection logic means for disabling the second downconversion path when the detected interferer level is less than a first predetermined threshold.

22. A computer program product storing code for causing a computer to configure a receiver for processing a radio-frequency signal (RF), the receiver comprising a first downconversion path configured to downconvert a first signal derived from the RF signal using a first mixing frequency, the receiver further comprising a second downconversion path configured to downconvert a second signal derived from the RF signal using a second mixing frequency distinct from the first mixing frequency, the code comprising:
   code for causing the computer to detect the level of an interferer present in the RF signal; and
   code for causing the computer to disable the second downconversion path when the detected interferer level is less than a first predetermined threshold.

* * * * *